United States Patent
Lee

(10) Patent No.: US 9,947,374 B2
(45) Date of Patent: Apr. 17, 2018

(54) SEMICONDUCTOR DEVICES AND SEMICONDUCTOR SYSTEMS INCLUDING THE SAME

(71) Applicant: SK hynix Inc., Icheon-si Gyeonggi-do (KR)

(72) Inventor: Chang Hyun Lee, Guri-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/080,216

(22) Filed: Mar. 24, 2016

(65) Prior Publication Data

US 2017/0103787 A1  Apr. 13, 2017

(30) Foreign Application Priority Data

Oct. 12, 2015 (KR) .................. 10-2015-0142080

(51) Int. Cl.
    G05F 1/10     (2006.01)
    G11C 5/14     (2006.01)
    G11C 7/10     (2006.01)
    G11C 16/26    (2006.01)

(52) U.S. Cl.
    CPC ............ G11C 5/147 (2013.01); G11C 5/143 (2013.01); G11C 7/1057 (2013.01); G11C 7/1084 (2013.01); G11C 16/26 (2013.01)

(58) Field of Classification Search
    CPC ........ H03F 1/223; H03F 3/193; H03F 1/0266; H03F 1/3205; H03F 2200/18; H03F 2200/294; H03F 2200/372; H03F 2200/451; H03F 2203/21106; H03F 2203/21112; H03F 2203/21142; H03F 3/195; H03F 3/21; H03F 3/211; G05F 1/56; G05F 1/575; G11C 13/0038; G11C 7/062; G11C 16/26; G11C 16/28; G11C 5/143; G11C 5/144; G11C 7/1057; G11C 7/1084; G11C 7/1087
    USPC ........................................... 327/538
    See application file for complete search history.

(56) References Cited

U.S. PATENT DOCUMENTS

| | | | | |
|---|---|---|---|---|
| 5,420,527 A * | 5/1995 | Naber | ............ | H03K 19/018535 326/116 |
| 8,008,951 B2 * | 8/2011 | Isik | .................. | H03K 17/102 326/83 |
| 2011/0219274 A1 * | 9/2011 | Cho | .................. | G06F 11/00 714/708 |
| 2012/0126874 A1 * | 5/2012 | Choi | ............. | H03K 3/356182 327/333 |

(Continued)

FOREIGN PATENT DOCUMENTS

KR     1020120098025 A     9/2012

*Primary Examiner* — Patrick Chen
(74) *Attorney, Agent, or Firm* — William Park & Associates Ltd.

(57) ABSTRACT

A semiconductor system includes a first semiconductor device and a second semiconductor device. The first semiconductor device outputs a power supply voltage and first data. The second semiconductor device generates a control voltage whose level is adjusted in response to the power supply voltage. The second semiconductor device also receives the first data to generate second data having a swing width different from a swing width of the first data. The second data being driven is controlled by the control voltage.

11 Claims, 6 Drawing Sheets

(56) References Cited

U.S. PATENT DOCUMENTS

| | | | |
|---|---|---|---|
| 2012/0218832 A1* | 8/2012 | Lee | G11C 7/106 365/189.05 |
| 2015/0015224 A1 | 1/2015 | Yasusaka | |
| 2015/0102849 A1* | 4/2015 | Si | H03K 19/0175 327/333 |
| 2015/0244359 A1* | 8/2015 | Tran | H03K 19/185 327/143 |

* cited by examiner

SEMICONDUCTOR DEVICES AND SEMICONDUCTOR SYSTEMS INCLUDING THE SAME

CROSS-REFERENCE TO RELATED APPLICATIONS

The present application claims priority under 35 U.S.C 119(a) to Korean Patent Application No. 10-2015-0142080, filed on Oct. 12, 2015, which is incorporated herein by reference in its entirety.

BACKGROUND

1. Technical Field

Embodiments of the invention relate to semiconductor devices driving data and semiconductor systems including the same.

2. Related Art

Low cost, compact and large capacity semiconductor memory devices for storing data are increasingly in demand with the development of computer systems, electronic communication systems or the like. In addition, low power semiconductor memory devices have been developed to improve energy efficiency.

Meanwhile, various drivers may be employed in dynamic random access memory (DRAM) devices to perform a read operation or a write operation. For example, a driver for driving a global input and output (I/O) line may be used to transmit data to the global I/O line while the DRAM devices performs the read operation, and the driver for driving the global I/O line may also be used to transmit data inputted through data pads (i.e., DQ pads) to the global I/O line while the DRAM devices performs the write operation.

In general, the drivers included in the DRAM devices are realized using MOS transistors, and the MOS transistors operate with a drive voltage which is lower than a power supply voltage (VDD) in order to reduce current consumption during the read operation of the write operation. In such a case, the MOS transistors have to be designed to have a low threshold voltage because an operation voltage (i.e., the drive voltage) of the MOS transistors is lower than the power supply voltage (VDD).

SUMMARY

According to an embodiment, a semiconductor system includes a first semiconductor device and a second semiconductor device. The first semiconductor device outputs a power supply voltage and first data. The second semiconductor device generates a control voltage whose level is adjusted in response to the power supply voltage. The second semiconductor device also receives the first data to generate second data having a swing width different from a swing width of the first data. The second data being driven is controlled by the control voltage.

In addition, according to an embodiment, a semiconductor device includes a control voltage generation circuit and a swing width change circuit. The control voltage generation circuit generates a control voltage, a level of which is adjusted in response to a variable voltage generated to be proportional to a power supply voltage. The swing width change circuit receives first data to generate second data having a swing width different from a swing width of the first data. The second data being driven is controlled by the control voltage.

In addition, according to an embodiment, a semiconductor device includes a control signal generation circuit and a data drive circuit. The control signal generation circuit receives a power supply voltage and a control voltage to generate a pull-down control signal and a pull-up control signal in response to first data having a first swing width. The data drive circuit drives second data having a second swing width in response to the pull-down control signal and the pull-up control signal. The control voltage is controlled to have a level higher than the power supply voltage. Further, a swing width of the pull-up control signal is controlled by the control voltage.

The first data has a level that corresponds to the power supply voltage.

The first data has a level that corresponds to a ground voltage.

The second semiconductor device generates a variable voltage, wherein a level of the variable voltage changes according to a level of the power supply voltage.

The level of the variable voltage is half of the level of the power supply voltage.

The second semiconductor device generates the second data to be driven to have a level lower than the power supply voltage.

The level of the control voltage increases when the level of the variable voltage increases.

A level of the second data in relation to the power supply voltage is determined according to a logic level of the first data.

The level of the variable voltage changes in relation to a ratio of a plurality of resistive elements.

The second semiconductor device generates a drive voltage that is greater than the power supply voltage and the control voltage.

The control voltage is generated by comparing a feedback voltage with a reference voltage.

An amount of electric charges discharged from a node increases when the variable voltage increases.

A logic level of the first data determines whether the first data has a level that corresponds to the power supply voltage.

The level of the variable voltage is half of the level of the power supply voltage when resistance values for a plurality of resistive elements are equal.

The second semiconductor device drives the control voltage according to an amount of electric charges of an internal node.

The control voltage is generated according to a level of the power supply voltage.

DETAILED DESCRIPTION

Various embodiments of the invention will be described hereinafter with reference to the accompanying figures. However, the embodiments described herein are for illustrative purposes only and are not intended to limit the scope of the invention. Various embodiments are directed to semiconductor devices driving data and semiconductor systems including the same.

Figure 1:
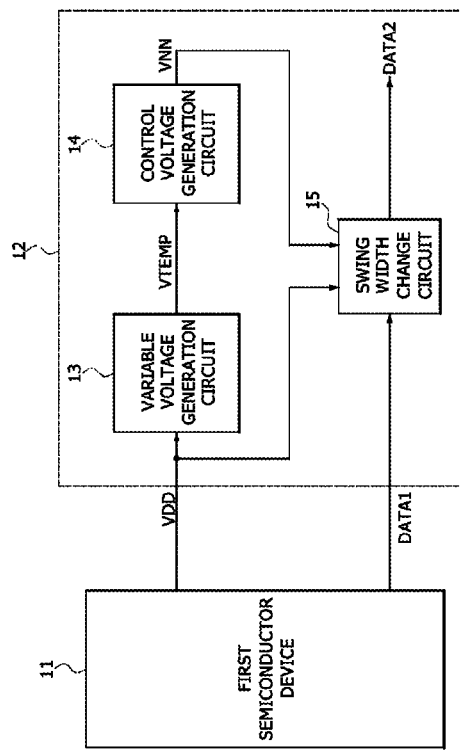
FIG. 1 is a block diagram illustrating a configuration of a semiconductor system according to an embodiment of the invention.

Referring to FIG. 1, a semiconductor system according to an embodiment of the invention may include a first semiconductor device 11 and a second semiconductor device 12. The internal components of the first semiconductor device 11 and the second semiconductor device 12 may each be configured as a circuit.

The first semiconductor device 11 may output a power supply voltage VDD and first data DATA1. The power supply voltage VDD may be set to be different according to the embodiments. A level of the power supply voltage VDD may change in a power-up section or in various operation modes. The first data DATA1 may have a logic high level or a logic low level according to an internal operation of the first semiconductor device 11. If the first data DATA1 have a logic high level, the first data DATA1 may have a level of the power supply voltage VDD. In contrast, if the first data DATA1 have a logic low level, the first data DATA1 may have a level of a ground voltage VSS. The first data DATA1 may have a swing width corresponding to a level difference between the power supply voltage VDD and the ground voltage VSS.

The second semiconductor device 12 may include a variable voltage generation circuit 13, a control voltage generation circuit 14, and a swing width change circuit 15. The variable voltage generation circuit 13 may receive the power supply voltage VDD to generate a variable voltage VTEMP. In more detail, the variable voltage generation circuit 13 may generate the variable voltage VTEMP, a level of which changes according to the level of the power supply voltage VDD. The variable voltage generation circuit 13 may receive the power supply voltage VDD to generate VTEMP which is proportional to the power supply voltage VDD. The variable voltage generation circuit 13 may generate the variable voltage VTEMP having a half level of the power supply voltage VDD. A ratio (i.e., a proportional constant) of the variable voltage VTEMP to the power supply voltage VDD may be set to be different according to the embodiments.

The control voltage generation circuit 14 may receive the variable voltage VTEMP to generate a control voltage VNN. The control voltage generation circuit 14 may generate the control voltage VNN, a level of which is adjusted in response to the variable voltage VTEMP. The control voltage generation circuit 14 may generate the control voltage VNN, a level of which increases as a level of the variable voltage VTEMP increases. The control voltage VNN may be set to have level which is higher than a level of the power supply voltage VDD.

The swing width change circuit 15 may receive the power supply voltage VDD and the control voltage VNN to drive second data DATA2 in response to the first data DATA1. The swing width change circuit 15 may receive the first data DATA1 to generate the second data DATA2 having a swing width which is different from a swing width of the first data DATA1. The swing width change circuit 15 may generate the second data DATA2 which is driven to have a level which is lower than the power supply voltage VDD if the first data DATA1 has a logic high level. The swing width change circuit 15 may receive the first data DATA1 having a first swing width to generate the second data DATA2 having a second swing width which is less than the first swing width.

Figure 2:
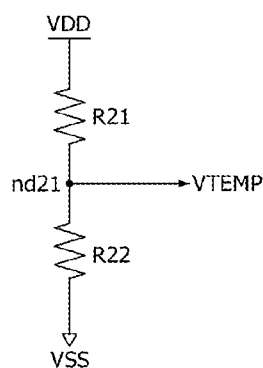
FIG. 2 is a circuit diagram of a variable voltage generation circuit included in the semiconductor system of FIG. 1.

Referring to FIG. 2, the variable voltage generation circuit 13 may include resistive elements R21 and R22. The resistive element R21 may be electrically coupled between the power supply voltage VDD terminal and a node nd21. The node nd21 may be a node through which the variable voltage VTEMP is outputted. The resistive element R22 may be electrically coupled between the node nd21 and a ground voltage VSS terminal. The variable voltage generation circuit 13 may generate the variable voltage VTEMP by dividing the power supply voltage VDD according to resistance values of the resistive elements R21 and R22. If the resistance values of the resistive elements R21 and R22 are equal to each other, the variable voltage VTEMP may be set to have a half level of the power supply voltage VDD. If a ratio of a resistance value of the resistive element R21 to a resistance value of the resistive element R22 varies, a level of the variable voltage VTEMP may also change. The level of the variable voltage VTEMP may be set to be different according to the embodiments.

Figure 3:
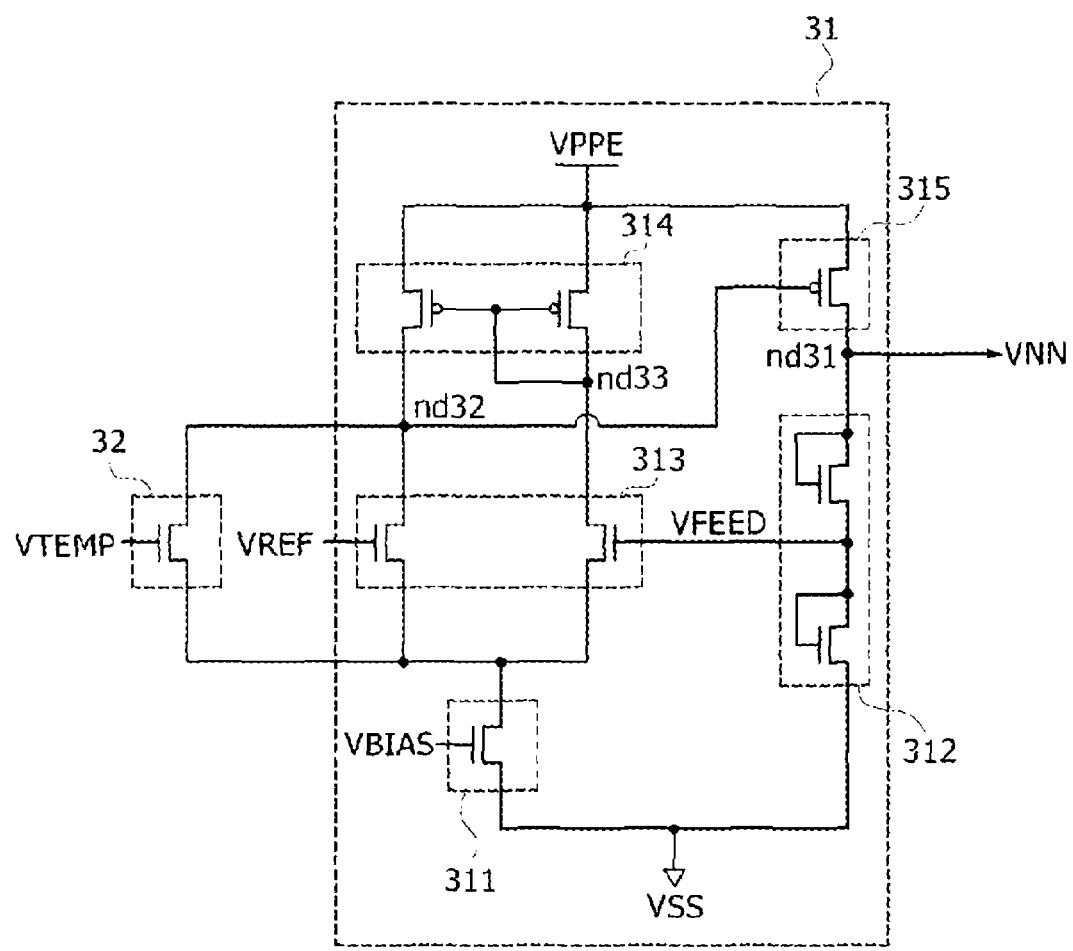
FIG. 3 is a circuit diagram of a control voltage generation circuit included in the semiconductor system of FIG. 1.

Referring to FIG. 3, the control voltage generation circuit 14 may include a control voltage drive circuit 31 and an electric charge emission circuit 32. The control voltage drive circuit 31 may include a bias unit 311, a voltage dividing unit 312, a comparison unit 313, an electric charge supply unit 314, and a drive unit 315. The bias unit 311 may activate the control voltage drive circuit 31 in response to a bias voltage VBIAS. The bias voltage VBIAS may have a constant voltage level regardless of variations of processes, voltages and/or temperatures (PVT). The voltage dividing unit 312 may generate a feedback voltage VFEED by dividing a voltage of a node nd31 through which the control voltage VNN is outputted. The voltage dividing unit 312 may generate the feedback voltage VFEED having a half level of the control voltage VNN. A level of the feedback voltage VFEED obtained by dividing the control voltage VNN may be set to be different according to the embodiments. The comparison unit 313 may compare the feedback voltage VFEED with a reference voltage VREF to discharge electric charges of one of nodes nd32 and nd33. The reference voltage VREF may have a constant level regardless of the power supply voltage VDD. The comparison unit 313 may discharge electric charges of the node nd32 if the reference voltage VREF is higher than the feedback voltage VFEED. The comparison unit 313 may discharge electric charges of the node nd33 if the reference voltage VREF is lower than the feedback voltage VFEED. The electric charge supply unit 314 may supply electric charges to the nodes nd32 and nd33 if an amount of electric charges of the node nd33 is less than a certain value. The drive unit 315 may drive the control voltage VNN according to an amount of electric charges of the node nd32. The drive unit 315 may pull up the control voltage VNN to a drive voltage VPPE if an amount of electric charges of the node nd32 is less than a certain value so that a voltage level of the node nd32 is lower than the drive voltage VPPE. In contrast, the drive unit 315 may terminate driving the control voltage VNN if an amount of electric charges of the node nd32 is greater than a certain value so that a voltage level of the node nd32 is close to the drive voltage VPPE. The drive voltage VPPE may be set to be higher than the power supply voltage VDD and the control voltage VNN. The drive voltage VPPE may be inputted from an external device or may be generated in the second semiconductor device 12. Accordingly, the control voltage drive circuit 31 may drive the control voltage VNN according to the amount of electric charges of the node nd31, which is adjusted by comparing the feedback voltage VFEED obtained by dividing the control voltage VNN with the reference voltage VREF. The control voltage drive circuit 31 may drive the control voltage VNN to a high level close to the drive voltage VPPE if the amount of electric charges of the node nd31 decreases. In contrast, the control voltage drive circuit 31 may terminate driving the control voltage VNN if the amount of electric charges of the node nd31 increases.

The electric charge emission circuit 32 may discharge electric charges of the node nd32 in response to the variable voltage VTEMP. The electric charge emission circuit 32 may discharge a large amount of electric charges from the node nd32 if a level of the variable voltage VTEMP rises up. If the variable voltage VTEMP increases to discharge the electric charges from the node nd32, the control voltage drive circuit 31 may drive the control voltage VNN to a high level close to the drive voltage VPPE. In various embodiments, the electric charges of the node nd32 may be discharged by a plurality of electric charge emission circuits which are controlled by different voltages.

Figure 4:
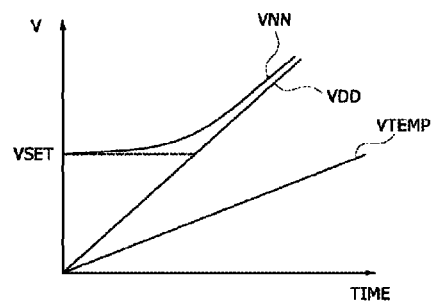
FIG. 4 is a graph illustrating an operation of the control voltage generation circuit shown in FIG. 3.

Referring to FIG. 4, a level of the control voltage VNN may vary if a level of the power supply voltage VDD changes. In FIG. 4, the abscissa represents "time", and the ordinate represents "a voltage level (V)". Since the variable voltage VTEMP is generated by dividing the power supply voltage VDD, the variable voltage VTEMP may increase in proportion to the power supply voltage VDD. If the power supply voltage VDD is low, the control voltage VNN may be generated by comparing the feedback voltage VFEED with the reference voltage VREF and the control voltage VNN may be higher than a set voltage VSET. The set voltage VSET may be set according to a level of the reference voltage VREF. In the electric charge emission circuit 32, an amount of electric charges discharged from the node nd32 may increase if the variable voltage VTEMP increases. Accordingly, a level of the control voltage VNN may gradually rise up if the variable voltage VTEMP increases while the control voltage VNN is higher than the set voltage VSET. The control voltage VNN may be always higher than the power supply voltage VDD.

Figure 5:
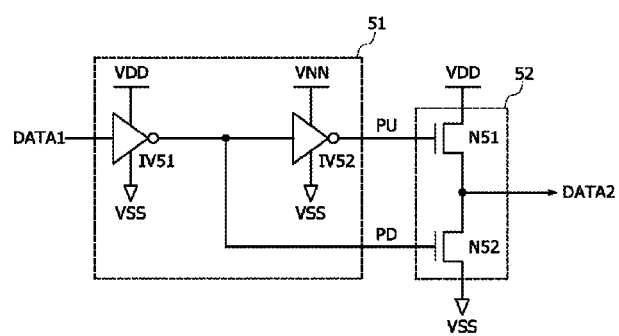
FIG. 5 is a circuit diagram of a swing width change circuit included in the semiconductor system of FIG. 1.

Referring to FIG. 5, the swing width change circuit 15 may include a control signal generation circuit 51 and a data drive circuit 52. The control signal generation circuit 51 may include inverters IV51 and IV52. The inverter IV51 may receive the power supply voltage VDD and the ground voltage VSS to inversely buffer the first data DATA1 and to output the inversely buffered first data as a pull-down control signal PD. If the first data DATA1 has a logic high level, the inverter IV51 may generate the pull-down control signal PD having a logic low level that corresponds to the ground voltage VSS. If the first data DATA1 has a logic low level, the inverter IV51 may generate the pull-down control signal PD having a logic high level that corresponds to the power supply voltage VDD. As a result, the pull-down control signal PD has a first swing width corresponding to a level difference between the power supply voltage VDD and the ground voltage VSS. The inverter IV52 may receive the control voltage VNN and the ground voltage VSS to inversely buffer the pull-down control signal PD and to output the inversely buffered pull-down control signal as a pull-up control signal PU. If the pull-down control signal PD has a logic low level, the inverter IV52 may generate the pull-up control signal PU which is driven to the control voltage VNN. If the pull-down control signal PD has a logic high level, the inverter IV52 may generate the pull-up control signal PU which is driven to the ground voltage VSS. Hence, the pull-up control signal PU has a third swing width corresponding to a level difference between the control voltage VNN and the ground voltage VSS.

The data drive circuit 52 may include NMOS transistors N51 and N52 which are electrically coupled in series between the power supply voltage VDD terminal and the ground voltage VSS terminal. The NMOS transistor N51 may receive the power supply voltage VDD to drive the second data DATA2 in response to the pull-up control signal PU. If the pull-up control signal PU having a logic high level is generated from the first data DATA1 having a logic high level, the NMOS transistor N51 may receive the pull-up control signal PU, which is driven to the control voltage VNN, through a gate thereof to drive the second data DATA2. If the level of the power supply voltage VDD is lower than a level of a voltage which is obtained by subtracting a threshold voltage of the NMOS transistor N51 from the control voltage VNN while the pull-up control signal PU is driven to the control voltage VNN, the second data DATA2 may be driven to the power supply voltage VDD. If the level of the power supply voltage VDD is lower than that of the control voltage VNN and higher than a level of a voltage which is obtained by subtracting the threshold voltage of the NMOS transistor N51 from the control voltage VNN while the pull-up control signal PU is driven to the control voltage VNN, the second data DATA2 may be driven to a level which is lower than a voltage which is obtained by subtracting the threshold voltage of the NMOS transistor N51 from the control voltage VNN. Since the control voltage VNN is generated to have a level higher than that of the power supply voltage VDD in the control voltage generation circuit 14, the pull-up control signal PU driven to the control voltage VNN may always have a level higher than that of the power supply voltage VDD. In general, if a gate voltage applied to a gate of an NMOS transistor is higher than a source voltage applied to a source of the NMOS transistor by at least a threshold voltage, the NMOS transistor may be turned on to allow a current to flow from a drain toward the source. Accordingly, a source voltage of the NMOS transistor may be driven to a voltage lower than a gate voltage thereof by at least the threshold voltage. In addition, if the gate voltage is lower than the drain voltage, the NMOS transistor may not be fully turned on. Accordingly, if a gate voltage of the NMOS transistor is equal to or higher than a drain voltage of the NMOS transistor, the NMOS transistor may be fully turned on.

The NMOS transistor N52 may receive the ground voltage VSS to drive the second data DATA2 in response to the pull-down control signal PD. If the control signal generation circuit 51 receives the first data DATA1 having a logic low level to generate the pull-down control signal PD having a logic high level, the NMOS transistor N52 may drive the second data DATA2 to the ground voltage VSS. If the second data DATA2 is driven to a logic high level, the second data DATA2 may be generated to have a level which is lower than a level of the control voltage VNN by at least a threshold voltage of the NMOS transistor N51. In addition, if the second data DATA2 is driven to a logic low level, the second data DATA2 may be generated to have a level of the ground voltage VSS. As a result, the second data DATA2 may be generated to have the second swing width. The swing width of the second data DATA2 may be controlled by adjusting the level of the control voltage VNN or by adjusting the threshold voltage of the NMOS transistor N51.

As described above, the swing width change circuit 15 may generate the pull-up control signal PU driven to the control voltage VNN to lower a logic high level of the drive of the second data DATA2, if the first data DATA1 having a logic high level is inputted thereto. Accordingly, current consumption of the second semiconductor device 12 may be reduced. In addition, the control voltage generation circuit 14 may generate the control voltage VNN higher than the power supply voltage VDD to prevent an abnormal operation of the NMOS transistor N51. As a result, malfunction of the second semiconductor device 12 may be prevented.

Figure 6:
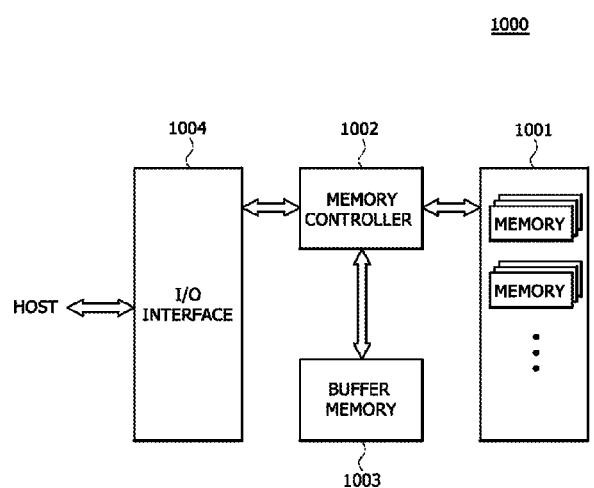
FIG. 6 is a block diagram illustrating a configuration of an electronic system employing the semiconductor device shown in FIG. 1 to FIG. 5.

The second semiconductor device 12 or the semiconductor system described with reference to FIGS. 1 to 5 may be applied to an electronic system that includes a memory system, a graphic system, a computing system, a mobile system, or the like. For example, as illustrated in FIG. 6, an electronic system 1000 according an embodiment may include a data storage unit 1001, a memory controller 1002, a buffer memory 1003, and an input/output (I/O) interface 1004.

The data storage unit 1001 may store data which are outputted from the memory controller 1002 or may read and output the stored data to the memory controller 1002 according to a control signal generated from the memory controller 1002. The data storage unit 1001 may include the second semiconductor device 12 illustrated in FIG. 1. The data storage unit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004. The memory controller 1002 may decode the command outputted from the host device to control an operation for inputting data into the data storage unit 1001 or the buffer memory 1003 or for outputting the data stored in the data storage unit 1001 or the buffer memory 1003. The memory controller 1002 may include the first semiconductor device 11 illustrated in FIG. 1. Although FIG. 6 illustrates the memory controller 1002 with a single block, the memory controller 1002 may include one controller for controlling the data storage unit 1001 comprised of a nonvolatile memory and another controller for controlling the buffer memory 1003 comprised of a volatile memory.

The buffer memory 1003 may temporarily store the data which are processed by the memory controller 1002. The buffer memory 1003 may temporarily store the data which are outputted from or to be inputted to the data storage unit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically couple the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. The electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor system comprising:
   a first semiconductor device configured for outputting a power supply voltage and first data; and
   a second semiconductor device configured for generating a control voltage whose level is adjusted in response to the power supply voltage and for receiving the first data to generate second data having a swing width different from a swing width of the first data,
   wherein the second data being driven is controlled by the control voltage,
   wherein the level of the control voltage is higher than a level of the power supply voltage, and
   wherein the second semiconductor device includes a control voltage generation circuit configured for comparing a feedback voltage obtained by dividing the control voltage with a reference voltage to drive the control voltage according to an amount of electric charges of a node.

2. The semiconductor system of claim 1, wherein the swing width of the first data corresponds to a level difference between the power supply voltage and a ground voltage.

3. The semiconductor system of claim 1, wherein the swing width of the second data is set to be less than the swing width of the first data.

4. The semiconductor system of claim 1, wherein the second semiconductor device includes:
   a variable voltage generation circuit configured for dividing the power supply voltage to generate a variable voltage; and
   the control voltage generation circuit configured for generating the control voltage, the level of which is adjusted in response to the variable voltage.

5. The semiconductor system of claim 4, wherein the control voltage generation circuit includes:
   a control voltage drive circuit configured for comparing the feedback voltage obtained by dividing the control voltage with the reference voltage to drive the control voltage according to an amount of electric charges of the node; and
   an electric charge emission circuit configured for discharging the electric charges of the node in response to the variable voltage.

6. The semiconductor system of claim 1, wherein the second semiconductor device includes:
   a swing width change circuit configured for receiving the power supply voltage and the control voltage to generate the second data, wherein the swing width of the second data is changed in response to the first data.

7. The semiconductor system of claim 6, wherein the swing width change circuit includes:
   a control signal generation circuit configured for receiving the power supply voltage and the control voltage to generate a pull-down control signal and a pull-up control signal in response to the first data; and
   a data drive circuit configured for receiving the power supply voltage to drive the second data in response to the pull-down control signal and the pull-up control signal.

8. The semiconductor system of claim 7, wherein the pull-down control signal has a first swing width and the pull-up control signal has a second swing width.

9. The semiconductor system of claim 7, wherein the control signal generation circuit includes:
   a first inverter configured for receiving the power supply voltage and configured for inversely buffering the first data to generate the pull-down control signal; and
   a second inverter configured for receiving the control voltage and configured for inversely buffering the pull-down control signal to generate the pull-up control signal.

10. The semiconductor system of claim 7, wherein the data drive circuit includes:
    a first MOS transistor configured for receiving the power supply voltage to drive the second data in response to the pull-up control signal; and
    a second MOS transistor configured for receiving a ground voltage to drive the second data in response to the pull-down control signal.

11. The semiconductor system of claim 10, wherein each of the first MOS transistor and the second MOS transistor is realized using an NMOS transistor.

* * * * *